United States Patent
Kiyomori et al.

(10) Patent No.: US 8,541,631 B2
(45) Date of Patent: Sep. 24, 2013

(54) SURFACE TREATMENT METHOD FOR SOLID MATERIAL

(75) Inventors: Ayumu Kiyomori, Joetsu (JP); Yusuke Itoh, Joetsu (JP); Tohru Kubota, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 151 days.

(21) Appl. No.: 12/975,931

(22) Filed: Dec. 22, 2010

(65) Prior Publication Data

US 2011/0160464 A1 Jun. 30, 2011

(30) Foreign Application Priority Data

Dec. 24, 2009 (JP) ................. 2009-292478

(51) Int. Cl.
*C07C 41/09* (2006.01)
(52) U.S. Cl.
USPC ........................................ 568/698
(58) Field of Classification Search
USPC ........................................ 541/444; 568/698
See application file for complete search history.

(56) References Cited

U.S. PATENT DOCUMENTS

| | | |
|---|---|---|
| 5,380,585 A | 1/1995 | Ogawa et al. |
| 6,548,116 B2 | 4/2003 | Ogawa |

FOREIGN PATENT DOCUMENTS

| | | |
|---|---|---|
| EP | 1 693 350 A1 | 8/2006 |
| JP | 4-221630 A | 8/1992 |
| JP | 8-337654 A | 12/1996 |
| JP | 10-151421 A | 6/1998 |
| JP | 2001-125306 A | 5/2001 |
| JP | 2001-194824 A | 7/2001 |
| JP | 2004-010751 A | 1/2004 |
| WO | 00/47666 A1 | 8/2000 |
| WO | 01/21717 A1 | 3/2001 |
| WO | 2006/065124 A1 | 6/2006 |
| WO | 2007/031775 A1 | 3/2007 |

OTHER PUBLICATIONS

European Search Report dated Mar. 25, 2011, issued in corresponding European Patent Application No. 10252173.9.
Japanese Office Action dated Apr. 4, 2012, issued in corresponding application 2009-292478.

*Primary Examiner* — Taofiq A Solola
(74) *Attorney, Agent, or Firm* — Westerman, Hattori, Daniels & Adrian, LLP

(57) ABSTRACT

A solid material is subjected to surface treatment by chemically bonding onto a surface of the solid material a stabilized monofunctional silanol represented by $R^1R^2R^3SiOH$. $R^1$, $R^2$ and $R^3$ may be the same or different, and each represent a substituent group independently selected from a substituted or unsubstituted, monovalent hydrocarbon group having from 1 to 40 carbon atoms or a substituted or unsubstituted, monovalent heterocyclic group having from 1 to 100 carbon atoms. The monofunctional silanol has a dehydrative self-condensation rate lower than triethylsilanol.

2 Claims, No Drawings

SURFACE TREATMENT METHOD FOR SOLID MATERIAL

CROSS-REFERENCE TO RELATED APPLICATION

This non-provisional application claims priority under 35 U.S.C. §119(a) on Patent Application No. 2009-292478 filed in Japan on Dec. 24, 2009, the entire contents of which are hereby incorporated by reference.

TECHNICAL FIELD

This invention relates to a surface treatment method for a solid material.

BACKGROUND ART

Research on organic monolayers has been continued over many years, and LB (Langmuir-Blodgett) films, organothiol films, organosilane films and the like are known. As such organic monolayers can achieve surface modifications without affecting the surface morphology (microstructures, planarities, and the like) of substrates or base materials (hereinafter simply called "substrates") owing to their molecular-height thicknesses, their full-scale exploitation is expected keeping in step with an increasing demand for miniaturization of semiconductors and microprocessing of MEMS (microelectromechanical systems), electronic parts and components, and the like.

Among these organic monolayers, monomolecular organosilicon films which make use of organosilicon compounds each having one or more hydrolyzable groups as film-forming materials can be readily formed as stable monolayers, because these organosilicon compounds can form covalent bonds with hydroxyl-containing materials. Accordingly, many reports have been made on them (see, for example, Patent Documents 1, 2, and 3). Different from the above-described LB films and organothiol films, a monomolecular organosilicon film makes use of hydroxyl groups on a surface of a solid material, said surface being to be treated, as reaction sites with its film-forming compound.

As a precursor for organosilicon monolayer, silicon compounds susceptible to hydrolysis such as alkoxysilanes and chlorosilanes are used. These compounds can directly interacts with surface hydroxyl groups of a solid, leading to dealcoholation or dehydrochlorination. Here, particularly in the case of allkoxysilanes, the dealcoholation is slow, rendering them to be hydrolyzed by water in the system to afford silanols first. Thereafter, the silanols in turn reacts with surface hydroxyl groups of a solid to form chemical bonds. Thus, the direct precursor seems to be silanols. However alkoxysilanes are the practical precursor of choice. The reason of the choice is that silanols may give irreproducible results of monolayer formation and may not be used efficiently as precursor, owing to their general thermal instability compared with alkoxylsilane counterparts, leading to dehydrative self-condensation to result in disiloxanes and siloxane polymers during storage or in the monolayer forming process. For allowing the above-described hydrolysis reaction of the alkoxysilane and the subsequent reaction with the surface hydroxyl groups to proceed efficiently, it is a common practice to add a catalyst such as an acid or base (see, for example, Patent Documents 1 and 2).

However, this catalyst also acts as a condensation catalyst for the silanol so that the resulting silanol is converted into an inert siloxane.

When chlorosilane is used, prior hydrolysis is not absolutely needed because chlorosilane has high reactivity with surface hydroxyl groups. However, this high reactivity leads to poor chemical stability, and needs exceptional attention upon its storage or use, for example, the use of an anhydrous solvent (see, for example, Patent Document 3). Further, highly toxic and corrosive hydrogen chloride is produced upon formation of a film, so that chlorosilane is hardly usable in applications expected as primary applications of monolayer treatment, such as semiconductors and electronic parts or components.

As another problem of the use, as a precursor, of an organosilicon compound that forms an unstable silanol as described above, there is a potential problem in that the resulting film may no longer be a true monolayer at a part or parts or the entire part thereof. Specifically, a siloxane polymer may be formed by self-condensation of the silanol, and may deposit as coarse particles on a surface of a substrate. Further, disorder may occur in a part or parts of the film structure to form a multilayer film.

Therefore, the above-described problems would all be solved successfully if the surface treatment for the formation of a monolayer would be feasible by using a thermally and chemically stable silanol as a precursor. In general, however, the stability and reactivity of a compound are mutually-contradictory properties, thereby involving a problem that the reactivity drops as the stability increases.

Citation List
Patent Document 1: JP-A H8-337654
Patent Document 2: JP-A H10-151421
Patent Document 3: JP-A H4-221630

SUMMARY OF INVENTION

An object of the present invention is, therefore, to provide a method for forming a high-reliability monolayer by using a stable organosilicon compound as a precursor.

The present inventors have found that monofunctional silanols having a specific structure are thermally and chemically stable and have adequate reactivity to solid materials, leading to the completion of the present invention.

There is thus provided the following surface treatment method for a solid material, comprising chemically bonding onto a surface of the solid material a stabilized monofunctional silanol represented by the following formula (1):

$$R^1R^2R^3SiOH \tag{1}$$

wherein $R^1$, $R^2$ and $R^3$ may be the same or different and each represent a substituent group independently selected from a substituted or unsubstituted, monovalent hydrocarbon group having from 1 to 40 carbon atoms or a substituted or unsubstituted, monovalent heterocyclic group having from 1 to 100 carbon atoms, with a proviso that the monofunctional silanol represented by the formula (1) has a dehydrative self-condensation rate lower than triethylsilanol.

In the formula (1), the total number of carbons of $R^1$, $R^2$ and $R^3$ is preferably at least ten, and $R^1$ and $R^2$ are preferably an isopropyl group.

In the method, catalysts may not be required upon chemically bonding the silanol of the formula (1), onto the surface of the solid material.

ADVANTAGEOUS EFFECTS OF INVENTION

In the present invention, the surface treatment for the formation of a monolayer is conducted by using, as a precursor, the stabilized silanol substantially free of self-condensing property. That promises a high use efficiency of a film forming compound and no multilayer film due to disorder of the film structure. Accordingly, there is provided a surface treatment method for a solid material by an organosilicon monolayer with a high-reproducibility and a high-reliability.

DESCRIPTION OF EMBODIMENTS

In the surface treatment method according to the present invention, the compound as the film-forming precursor is a monofunctional silanol characterized in that it is represented by the below-described formula (1) and it has a dehydrative self-condensation rate lower than triethylsilanol.

$$R^1R^2R^3SiOH \quad (1)$$

In the formula (1), $R^1$, $R^2$ and $R^3$ may be the same or different, and are each a substituted or unsubstituted, monovalent hydrocarbon group having from 1 to 40, preferably from 1 to 30, more preferably from 1 to 20 carbon atoms or a monovalent heterocyclic group having from 1 to 100, preferably from 1 to 80, more preferably from 1 to 60 carbon atoms. Examples of the monovalent hydrocarbon group include linear, branched and cyclic alkyl groups, alkenyl groups, alkynyl groups, aryl groups, aralkyl groups, and the like. One or more of the hydrogen atoms of each of these monovalent hydrocarbon groups may be substituted by a like number of atoms and/or groups selected from halogen atoms such as fluorine and chlorine atoms, acyl groups such as acetyl and benzoyl groups, acryloxy groups such as acetoxy and benzoyloxy groups, amido groups such as acetamido and benzamido groups, ester groups such as methoxycarbonyl and ethoxycarbonyl groups, organoxy groups such as methoxy, ethoxy, isopropoxy, tert-butoxy, methoxyethoxy, ethoxyethoxy, phenoxy and benzyloxy groups, substituted amino groups such as dimethylamino, diethylamino, diethylaminoethylamino, phenylamino and diphenylamino groups, cyano groups, nitro groups, and the like. Examples of the monovalent heterocyclic group include tetrazolyl, triazolyl, imidazolyl, benzimidazolyl, pyridyl, bipyridyl, terpyridyl, carbazolyl, phenanthrolinyl, piperidinyl, pyrollyl, indolyl, indolinyl, oxyindolyl, pyrrolidinyl, piperazinyl, 2-oxypyrrolidino, 2-oxypiperidino, furyl, benzofuryl, dibenzofuryl, tetrahydrofuryl, thienyl, benzothienyl, dibenzothienyl, bithiophenyl, terthiophenyl, quadrithiophenyl, silolyl, benzosilolyl, dibenzosilolyl, silacyclopentyl, and silacyclohexyl groups; and hydrocarbon groups each substituted by one or more of these monovalent heterocyclic groups. One or more of the hydrogen atoms of each of these heterocyclic groups may be substituted by a like number of atoms and/or groups selected from halogen atoms such as fluorine and chlorine atoms, acyl groups such as acetyl and benzoyl groups, acryloxy groups such as acetoxy and benzoyloxy groups, amido groups such as acetamido and benzamido groups, ester groups such as methoxycarbonyl and ethoxycarbonyl groups, organoxy groups such as methoxy, ethoxy, isopropoxy, tert-butoxy, methoxyethoxy, ethoxyethoxy, phenoxy and benzyloxy groups, hydrocarbon groups such as methyl, ethyl, propyl, isopropyl, tert-butyl, hexyl, octyl and phenyl groups, piperidino groups, pyrrolidino groups, N-methylpiperadino groups, substituted amino groups such as dimethylamino, diethylamino, diethylaminoethylamino and diphenylamino groups, cyano groups, nitro groups, and the like.

Specific examples of the substituent groups represented by $R^1$, $R^2$ and $R^3$ include methyl, ethyl, propyl, isopropyl, butyl, isobutyl, sec-butyl, tert-butyl, pentyl, cyclopentyl, isoamyl, tert-amyl, hexyl, cyclohexyl, thexyl, phenyl, 2-norbornyl, 2-norbornen-5-yl, 2-norbornen-5-ylethyl, tolyl, benzyl, octyl, 2-ethylhexyl, phenethyl, styryl, 4-vinylphenyl, 4-ethenylphenyl, 4-styrylphenyl, 3-styrylphenyl, azulyl, decyl, naphthyl, dodecyl, tetradecyl, hexadecyl, octadecyl, vinyl, allyl, ethynyl, phenylethynyl, 9-fluorenyl, 9,9-dimethylfluoren-2-yl, 3-chloropropyl, trifluoropropyl, nonafluorohexyl, tridecafluorooctyl, heptadecafluorodecyl, pentafluorophenyl, 4-acetylphenyl, 4-benzoylphenyl, acetoxypropyl, methacryloyloxypropyl, acetaminopropyl, 4-acetaminophenyl, methoxycarbonylphenyl, tert-butoxycarbonylphenyl, methoxycarbonyldecyl, methoxypropyl, ethoxyethoxypropyl, dimethylaminophenyl, diphenylaminophenyl, diethylaminopropyl, N-phenylaminopropyl, cyanoethyl, cyanophenyl, nitrophenyl, 5-tetrazolyl, 1,2,4-triazol-3-yl, 1,3-imidazol-4-yl, benzimidazol-5-yl, 1-ethylcarbazol-3-yl, carbazol-1-ylpropyl, 4-methylpyridyl, 2-pyridylethyl, 2,2'-bipyridin-6-yl, piperidinopropyl, 2-oxypyrrolidinoethyl, 2-oxypyrrolidinopropyl, piperadinopropyl, 3-furyl, 3-thienyl, 5-hexyl-2-thienyl, 2-thienylvinyl, 2,2'-bithiophen-5-yl, 2,2'-bithiophen-5-ylstyryl, 4-hexylthiophen-3-yl, 3-hexylthiphen-2-yl, 3,4-ethylenedioxythiophen-2-yl, 1,1-dimethyldibenzosilol-3-yl, and the like.

The dehydrative self-condensation rate of silanol can be measured by various methods. To compare the relative magnitudes of dehydrative self-condensation rates of plural silanols, it is only necessary to conduct measurement of their dehydrative self-condensation rates under the same temperature, pressure and concentration conditions. As a simplest method, the reaction rate of a silanol to be measured can be estimated by placing the silanol under constant temperature and pressure, measuring the amount of disiloxane, which is a product of the dehydrative self-condensation, produced during every predetermined time, and plotting the degree of conversion in an initial stage of the reaction (up to about 10% in terms of the degree of conversion). In the case of silanol the condensation rate of which is slow, an accelerated test can be performed by a method such as, for example, heating. Described more specifically, with respect to triethylsilanol as a standard substance, the production amount of hexaethyldisiloxane, which is a dehydrating condensation product, is determined at constant time intervals under constant temperature (for example, 100° C.) and constant pressure (for example, 1 atm). The progress of the dehydrating condensation reaction can be determined by a general analysis method such as, for example, gas chromatography or liquid chromatography. A similar test is next performed on silanol, with which a comparison is desired. The amount of disiloxane produced during every elapsed time is determined, and the degree of conversion is plotted. By comparing these plots with those of triethylsilanol, it is possible to determine whether or not the self-hydrating condensation rate of silanol is lower compared with that of triethylsilanol. If silanol is solid under measurement conditions, the measurement is conducted after preparing a silanol solution by using a solvent, and the self-hydrating condensation rate of silanol is compared with that of triethylsilanol measured in the same solvent and at the same concentration. The solvent to be used is a solvent that does not react to silanol, the resulting disiloxane or water under the measurement conditions. Illustrative are hydrocarbon-based solvents such as hexane, heptane, isooctane, toluene, xylene and mesitylene, and ether-based solvents such as diethyl ether, tetrahydrofuran and anisole.

Specific examples of the compound represented by formula (1) include tert-butyldimethylsilanol, methyldiisopropylsilanol, tert-amyldimethylsilanol, ethyldiisopropylsilanol, thexyldimethylsilanol, triisopropylsilanol, propyldiisopropylsilanol, 3-chloropropyldiisopropylsilanol, 3-acetoxypropyldiisopropylsilanol, 3-(2-oxopyrrolidino)

propyldiisopropylsilanol, methyl-di-(sec-butyl)silanol, 1-methylcyclohexyldimethylsilanol, butyldiisopropylsilanol, tert-butyldiisopropylsilanol, ethyl-di-(sec-butyl)silanol, phenyldiethylsilanol, thexyldiethylsilanol, isopropyldiisobutylsilanol, pentyldiisopropylsilanol, cyclopentyldiisopropylsilanol, propyl-di-(sec-butyl)silanol, isopropyl-di-(sec-butyl)silanol, allyl-di-(sec-butyl)silanol, 3-chloropropyl-di-(sec-butyl)silanol, 3-acetoxypropyl-di-(sec-butyl)silanol, 3-(2-oxopyrrolidino)propyl-di-(sec-butyl)silanol, phenylisopropylethylsilanol, methyldicyclopentylsilanol, hexyldiisopropylsilanol, cyclohexyldiisopropylsilanol, phenyldiisopropylsilanol, butyl-di(sec-butyl)silanol, sec-butyldiisobutylsilanol, ethyldicyclopentylsilanol, benzyldiisopropylsilanol, propyldicyclopentylsilanol, isopropyldicyclopentylsilanol, allyldicyclopentylsilanol, 3-chloropropyldicyclopentylsilanol, 3-acetoxypropyldicyclopentylsilanol, 3-(2-oxopyrrolidino)propyldicyclopentylsilanol, methyldiphenylsilanol, octyldiisopropylsilanol, 2-ethylhexyldiisopropylsilanol, ethyldiphenylsilanol, decyldiisopropylsilanol, butyldiphenylsilanol, tert-butyldiphenylsilanol, dodecyldiisopropylsilanol, tri-(m-tolyl)silanol, octadecyldiisopropylsilanol, 4-[4-(diphenylamino)styryl]phenyldiisopropylsilanol, 4-[4-(dimethylamino)styryl]phenyldiisopropylsilanol, 5-[4-(diphenylamino)phenyl]-5'-[3-(hydroxydiisopropylsilyl)-styryl]-2,2'-bithiophene, 5-[4-(bis(9,9-dimethylfluoren-2-yl)amino)phenyl]-5'-[3-(hydroxydiisopropylsilyl)styryl]-2,2'-bithiophene, and the like.

The compound represented by the formula (1) may be used in a desired amount. In general, however, it is preferred to use the compound of the formula (1) in an excess amount, specifically in an amount of 10 molar times or more, relative to the number of surface hydroxyl groups of a solid material to be subjected to the surface treatment. The unreacted excess can be recovered and reused.

In the surface treatment method according to the present invention, examples of the solid material include, but are not limited to, metals such as silicon, germanium, gallium, indium, iron, nickel, copper, cobalt, chromium, molybdenum, ruthenium, silver, brass and stainless steel; metal oxides such as silicon oxide, germanium oxide, titanium oxide, zinc oxide, zirconium oxide, tin oxide, aluminum oxide, magnesium oxide, indium oxide, barium titanate, lead zirconate titanate, indium tin oxide, aluminum zinc oxide, indium zinc oxide and fluorine-doped tin oxide; and glasses such as soda-lime glass and borosilicate glass. No limitation is imposed either on the form of the solid material, and therefore, the surface treatment method according to the present invention can be applied to any form, including plates, balls, boards, particles, porous forms, etc. No limitation is imposed either on the surface configuration of the solid material, and accordingly, the surface treatment method according to the present invention can be applied to any surface configuration, including planar configurations, curved configurations, microstructures, nanostructures, etc.

In the surface treatment method according to the present invention, the solid material can be used as it is when it has hydroxyl groups on its surface. If hydroxyl groups are not sufficient, hydrophilization treatment may preferably be applied to increase reaction sites. The number of surface hydroxyl groups can be increased by applying dry treatment such as oxygen plasma treatment, corona treatment or UV ozone treatment or wet treatment making use of piranha solution (sulfuric acid-hydrogen peroxide) such that a surface of an inorganic material can be subjected to oxidative hydrophilization treatment. An organic material such as plastics may also be used as it is, insofar as it has hydroxyl groups or carboxyl groups. Similar to inorganic materials, however, this organic material can also be subjected at a surface thereof to oxidative hydrophilization treatment. As an alternative, reaction sites can also be increased by applying a thin inorganic film of silicon oxide or the like to the surface.

In the surface treatment method according to the present invention, the solid material and the compound represented by the formula (1) can be brought into contact with each other in a desired manner. Illustrative are a liquid phase method that prepares a solution of the compound represented by the formula (1) and dips the solid material in the solution and a vapor phase method that vaporizes the compound represented by the formula (1) in a reaction chamber and allows the solid material to exist there to adsorptively form a film in the vapor phase.

A catalyst may also be used in the surface treatment method according to the present invention. A variety of materials, which show either acidic property or basic property, can be used as catalysts. Specific examples include Brensted acids such as hydrochloric acid, sulfuric acid, nitric acid, acetic acid, phosphoric acid, formic acid, trifluoroacetic acid, methanesulfonic acid, trifluoromethanesulfonic acid, dodecylbenzenesulfonic acid and paratoluenesulfonic acid; Lewis acids such as titanium tetrachloride, aluminum chloride, iron chloride, tin chloride, zinc chloride, dibutyltin dilaurate, titanium tetraisopropoxide, boron trichloride, tris(pentafluorophenyl)borane, yttrium triflate, ytterbium triflate, trimethylsilyl triflate and tert-butyldimethylsilyl triflate; solid acids such as activated clay and cation-exchange resins; alkali metal salts such as sodium hydroxide, lithium hydroxide, potassium hydroxide, rubidium hydroxide, cesium hydroxide, sodium methoxide, sodium ethoxide, potassium methoxide, sodium phenoxide, potassium tert-butoxide, sodium carbonate, potassium carbonate, cesium carbonate, sodium hydrogencarbonate, potassium hydrogensulfate, potassium phosphate and sodium dihydrogenphosphate; alkaline earth metal salts such as magnesium hydroxide, calcium hydroxide, barium hydroxide, strontium hydroxide, magnesium oxide and calcium oxide; metal oxides such as aluminum oxide, tin oxide, zinc oxide, zirconium oxide, titanium oxide, yttrium oxide and scandium oxide; nitrogen compounds such as ammonia, trimethylamine, diethylamine, triethylamine, tributylamine, pyrrolidone, piperidine, piperazine, 1,4-diazabicyclo[2.2.2]octane, 1,8-diazabicyclo[5.4.0]undecene, hexamethylenetetramine and guanidine; and onium salts such as ammonium chloride, ammonium sulfate, triethylammonium trifluoromethanesulfonate, pyridine hydrochloride, tributylphosphonium tetrafluoroborate, tetramethylammonium hydroxide and tetrabutylammonium hydroxide. The amount of the catalyst to be used is optional, and can be changed depending on the treatment speed. Preferably, however, the catalyst may be added at a ratio of from 0.0001 to 10 in terms of the molar ratio of the compound represented by the formula (1). Nonetheless, the treatment can be conducted without using any catalyst in the present invention, and such treatment under no catalyst is preferred.

In the treatment method according to the present invention, the temperature is optional, and can be changed as desired depending on the treatment speed. Preferably, however, the temperature may be from 0 to 300° C. The pressure is also optional, but normal pressure is most preferred for the dipping method that makes use of a solution of the compound of the formula (1). In the case of the vapor-phase method that brings vapor of the compound of the formula (1) and an inorganic solid into contact with each other, the surface treatment can be performed at normal pressure, or can be performed at reduced pressure to raise the vapor pressure of the compound.

EXAMPLE

The present invention will hereinafter be described more specifically based on Examples and Comparative Examples.

Synthesis Example 1

Synthesis of Octadecyldiisopropylsilanol

A four-necked round-bottom flask fitted with a stirrer, thermometer, reflux condenser and dropping funnel was purged with nitrogen, and nitrogen was aerated to an upper part of the reflux condenser opened to the atmosphere to shut off air and moisture. Magnesium and dry tetrahydrofuran (THF) were charged into the flask. While stirring the contents, a solution of 1-chlorooctadecane in dry THF was added from the dropping funnel. Under solvent reflux, a reaction was conducted for two hours to prepare a THF solution of octadecylmagnesium chloride.

Another four-necked round-bottom flask, which was similar to the above-described flask and was fitted with a stirrer, thermometer, reflux condenser and dropping funnel, was provided, and was purged with nitrogen. Dichlorodiisopropylsilane was charged into the flask. While stirring under heat at 60° C., the THF solution of octadecylmagnesium chloride was added from the dropping funnel. Under solvent reflux, a reaction was allowed to continue. By GC-MS analysis of the reaction mixture, formation of octadecyldiisopropylchlorosilane as a principal product was confirmed.

The reaction mixture was allowed to cool to room temperature, and a 10 wt % aqueous solution of ammonium chloride was added, followed by stirring to dissolve the salt. After stirring at room temperature for two hours, the organic layer was subjected to GC-MS analysis. As a result, the octadecyldiisopropylchlorosilane was found to have been converted into octadecyldiisopropylsilanol. The organic layer was separated and fractionally distilled to obtain the octadecyldiisopropylsilanol as a fraction at a boiling point of 177° C./0.1 kPa.

Synthesis Example 2

Synthesis of 5-[4-(bis(9,9-dimethylfluoren-2-yl)-amino)phenyl-5'-[3-(hydroxydiisopropylsilyl)-styryl]-2,2'-bithiophene (compound of the below-described formula (2))

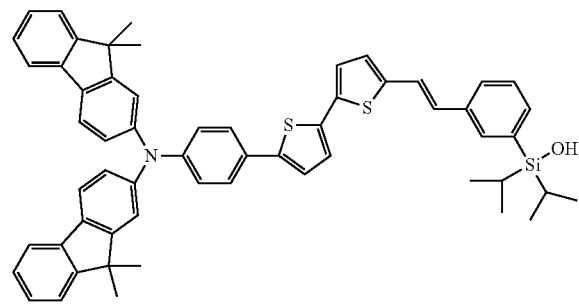

(2)

Under a nitrogen atmosphere, 5-[N,N-bis(9,9'-dimethylfluoren-2-yl)aminophenyl]-5'-vinyl-2,2'-biothiophene (241.2 mg, 0.36 mmol), m-hydroxydiisopropylsilylbromobenzene (122.5 mg, 0.43 mmol), sodium carbonate (65.8 mg, 0.62 mmol), 2,6-di-tert-butyl-4-methylphenol (13.3 mg, 0.06 mmol) and trans-di-μ-acetato-bis[o-(di-o-tolyl-phosphino)benzyl]-dipalladium(II) (13.5 mg, 0.014 mmol) were added to dimethylacetamide (5 ml), followed by stirring at 150° C. for 17 hours.

After the resultant solution was concentrated under reduced pressure, water and toluene were added, and then, the organic layer was extracted by separating operation. The thus-obtained solution was dried over magnesium sulfate, and was then concentrated under reduced pressure in a rotary evaporator. The concentrate was purified by HPLC to afford a yellow solid (103.4 mg). As a result of measurement of an NMR spectrum and MALDI-TOFMS spectrum of the solid, the solid was confirmed to be the compound of the formula (2).

$^1$H-NMR (300 MHz, δ, in CDCl$_3$): 0.99 (d, J=7.3 Hz, 6H), 1.07 (d, J=7.1 Hz, 6H), 1.14-1.33 (m, 2H), 1.42 (s, 12H), 1.70 (s, 1H), 6.88 (d, J=15.9 Hz, 1H), 6.98 (d, J=3.7 Hz, 1H), 7.08-7.70 (m, 28H)

MALDI-TOFMS m/z: 873.4 (M$^+$)

Example 1

Octadecyldiisopropylsilanol was mixed with toluene to prepare a colorless and clear, 50 mM toluene solution. That solution remained colorless and clear even after an elapse of three months at room temperature. A silicon wafer substrate was hydrophilized by UV ozone treatment, dipped for five minutes in the solution, and then pulled out of the solution. The solvent was allowed to evaporate. Subsequently, the substrate was heated for 30 minutes in an oven controlled at 150° C. The substrate was taken out of the oven, allowed to cool to room temperature, and then ultrasonically washed for one minute in toluene to eliminate unbound silane. Nitrogen was subsequently blown against the substrate at room temperature to dry the substrate. Upon analysis of the washing solution, unreacted octadecyldiisopropylsilanol was detected, but self-condensed dioctadecyltetraisopropyldisiloxane was not detected.

The contact angle of the resultant treated substrate to water (1 μL) was measured. As a result, the result shown in Table 1 was obtained. It is to be noted that as the value of contact angle, the average of values measured at three positions or four positions is described. Measurement of a surface of the treated substrate under an atomic force microscope (AFM) was conducted in an observation area of 10 μm square, and the arithmetic average roughness Ra of the surface was determined to be 0.21 nm. Particles having sizes of 50 nm and greater (coarse particles) were not observed. The result of X-ray photoelectric spectroscopy (XPS) measurement of the surface of the treated substrate is shown in Table 2.

Comparative Example 1

A substrate for comparison was obtained by conducting similar heating and washing treatment as in Example 1 except that the substrate was not dipped in the solution of octadecyldiisopropylsilanol. Its water contact angle was measured, and is shown in Table 1.

Comparative Example 2

A substrate for comparison was obtained by conducting a similar operation as in Example 1 except for the use of octadecyltrimethoxysilane in place of octadecyldiisopropylsilanol. Its water contact angle and the result of its measurement under AFM are shown in Table 1.

Comparative Example 3

Decyltrimethoxysilane, ethanol, water and nitric acid were vigorously mixed for two hours to obtain a colorless and clear solution of a decyltrimethoxysilane hydrolysate. A substrate for comparison was obtained by conducting similar heating and washing treatment as in Example 1 except that the substrate-dipping solution was replaced by the solution of the decyltrimethoxysilane hydrolysate. Its water contact angle was measured, and the result of the measurement is shown in Table 1. As a result of an observation of its surface configuration under AFM, the existence of many coarse particles of 50 nm and greater was confirmed. When stored at room temperature, the solution prepared in Comparative Example 3 gradually became clouded, resulting in the formation of a white precipitate one month later.

Comparative Example 4

In an attempt to prepare a solution of a hydrolysate, octadecyltrimethoxysilane was vigorously mixed together with ethanol, water and nitric acid. A white precipitate was formed. It was, therefore, unable to prepare a colorless and clear solution.

TABLE 1

| Samples | Water contact angle (degrees) | Surface roughness Ra (nm) | Average number of coarse particles (in 10 μm square area) |
|---|---|---|---|
| Substrate treated in Example 1 | 80 | 0.21 | 0 |
| Substrate treated in Comparative Example 1 | 8 | — | — |
| Substrate treated in Comparative Example 2 | 92 | 0.68 | 11 |
| Substrate treated in Comparative Example 3 | 103 | Very high | >100 |
| Untreated substrate | — | 0.18 | 0 |

TABLE 2

| | (unit: atomic %) | | | |
|---|---|---|---|---|
| Samples | Oxygen | Carbon | Silicon | Total |
| Untreated substrate | 41.7 | 1.7 | 56.6 | 100.0 |
| Substrate treated in Example 1 | 34.6 | 17.6 | 47.8 | 100.0 |

As shown in Tables 1 and 2, the water contact angle was greater in Example 1 than in Comparative Example 1 because octadecyldiisopropylsilanol was bonded on the substrate in Example 1. Further, the value of the surface roughness of the substrate treated in Example 1 as measured under AFM did not change substantially from that of the untreated substrate, and moreover, the amount of surface carbon atoms was determined to have increased in the substrate treated in Example 1 as a result of the surface analysis by XPS. A monolayer of octadecyldiisopropylsilanol is, therefore, determined to have been formed on the surface of the substrate treated in Example 1.

In Comparative Example 2, the substrate increased in contact angle as a result the coating of the octadecyltrimethoxysilane solution on the substrate and its heating in air. However, coarse particles of heights greater than 50 nm were observed under AFM. As a consequence, the substrate increased in surface roughness compared with the untreated substrate. Those coarse particles were formed of a siloxane polymer occurred by the hydrolysis and condensation of octadecyltrimethoxysilane, and therefore, no uniform, monomolecular silane film is considered to have been formed on the surface of the substrate.

In Comparative Example 3, the substrate increased in water contact angle owing to the use of the solution of the decyltrimethoxysilane hydrolysate. However, the adhesion of many coarse particles on the surface of the treated substrate was determined as a result of its observation under AFM. Therefore, no monolayer is considered to have been formed.

Hydrolysates of decyltrimethoxysilane and octadecyltrimethoxysilane are each a mixture of various silanols and their condensation products, and have low stability. As described in each of Comparative Examples 3 and 4, the condensation irreversibly proceeded so that the precipitate was formed. In contrast, the octadecyldiisopropylsilanol solution prepared in Example 1 remained stable over the long time, and therefore, had high economical efficiency without wasting the silicon compound.

Example 2

A 5 mM solution of 5-[4-(bis(9,9-dimethylfluoren-2-yl)amino)phenyl]-5'-[3-(hydroxydiisopropylsilyl)styryl]-2,2'-bithiophene (the compound represented by the following described formula (2)) in toluene was prepared. In the solution, an electrically-conductive glass (fluorine-doped tin oxide) substrate with a nanoparticulate $TiO_2$ film of 5 μm thickness formed thereon was dipped for 24 hours at room temperature. After the substrate was washed with toluene, the surface of the sample was analyzed by the electron probe microanalysis (EPMA) and XPS. The analysis results are shown in Table 3. Although there are some elements hardly detectable due to differences in relative sensitivity coefficient among respective elements and a difference in detection depth between the analysis methods, an integrated consideration of the results of these two analyses makes it possible to determine that the compound of the formula (2) was adsorbed in an effective amount on the surfaces of nanoparticles of titanium oxide. The solution of the compound (2) in toluene remained stable even after an elapse of three months or longer at room temperature, and allowed to conduct an adsorption operation as described above.

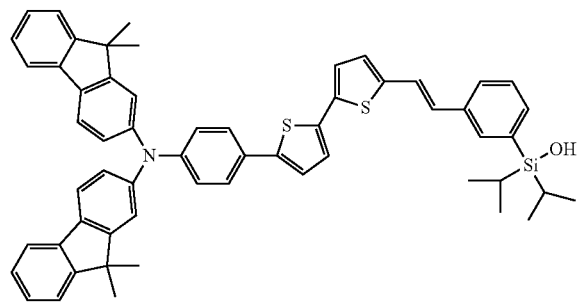

(2)

TABLE 3

| | O | Ti | C | N | S | Sn | Si | Total |
|---|---|---|---|---|---|---|---|---|
| | (unit: atomic %) | | | | | | | |
| EPMA | 62.0 | 26.7 | 10.1 | — | 0.6 | 0.2 | 0.4 | 100.0 |
| XPS | 35.3 | 12.3 | 49.8 | 1.1 | 1.2 | 0.3 | — | 100.0 |

Japanese Patent Application No. 2009-292478 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A surface treatment method for the formation of a monolayer for a solid material having hydroxyl group on its surface, comprising chemically bonding a stabilized monofunctional silanol represented by the following formula (1) onto the surface of the solid material without using any catalyst:

$$R^1R^2R^3SiOH \tag{1}$$

wherein $R^1$, $R^2$ and $R^3$ may be the same or different and each represent a substituent group independently selected from a substituted or unsubstituted, monovalent hydrocarbon group having from 1 to 40 carbon atoms or a substituted or unsubstituted, monovalent heterocyclic group having from 1 to 100 carbon atoms, with a proviso that the total number of carbons of $R^1$, $R^2$ and $R^3$ is at least ten and the monofunctional silanol represented by the formula (1) has a dehydrative self-condensation rate lower than triethylsilanol, to form an organosilicon monolayer.

2. The surface treatment method according to claim 1, wherein $R^1$ and $R^2$ are each an isopropyl group.

* * * * *